United States Patent [19]
Ackley et al.

[11] Patent Number: 5,553,084
[45] Date of Patent: Sep. 3, 1996

[54] ERROR CORRECTION ENHANCEMENT FOR CODE ONE AND OTHER MACHINE-READABLE SYMBOLOGIES

[75] Inventors: H. Sprague Ackley, Seattle; Christopher A. Wiklof, Everett, both of Wash.

[73] Assignee: Intermec Corporation, Everett, Wash.

[21] Appl. No.: 369,731

[22] Filed: Jan. 6, 1995

[51] Int. Cl.⁶ .............................. H03M 13/00; G06K 5/00
[52] U.S. Cl. ........................................ 371/37.1; 235/437
[58] Field of Search ............................ 371/37.1; 235/437

[56] References Cited

U.S. PATENT DOCUMENTS

| | | | |
|---|---|---|---|
| 4,988,852 | 1/1991 | Krishnan | 235/462 |
| 5,155,343 | 10/1992 | Chandler et al. | 235/462 |
| 5,304,787 | 4/1994 | Wang | 235/462 |
| 5,324,923 | 6/1994 | Cymbalski et al. | 235/454 |
| 5,378,881 | 1/1995 | Adachi | 235/462 |
| 5,378,883 | 1/1995 | Batterman et al. | 235/472 |

FOREIGN PATENT DOCUMENTS

0449634A2  10/1991  European Pat. Off. ......... G06K 7/10
0450878A1  10/1991  European Pat. Off. ......... G06K 7/10

OTHER PUBLICATIONS

*Uniform Symbology Specification Code One*, AIM USA, Pittsburgh, Pennsylvania, 1994, pp. 1–32.

Pavlidis, T., et al., "Information Encoding with Two-Dimensional Bar Codes", IEEE Computer, pp. 18–28.

*Primary Examiner*—Stephen M. Baker
*Attorney, Agent, or Firm*—Seed & Berry LLP

[57] ABSTRACT

A method and apparatus for error correction enhancement for machine-readable symbols applies particularly to symbols having symbol characters, repeating characters such as pad characters, and error correction characters derived from the symbol and pad characters. The method and apparatus read a selected symbol where the selected symbol has at least one damaged pad character. After failing to decode the symbol, the method determines that the symbol has at least one damaged pad character and then locates at least two consecutive pad characters in the selected symbol. The method replaces any damaged pad characters, and then again attempts to decode the symbol, using the error correction characters, after the pad characters have been replaced.

22 Claims, 6 Drawing Sheets

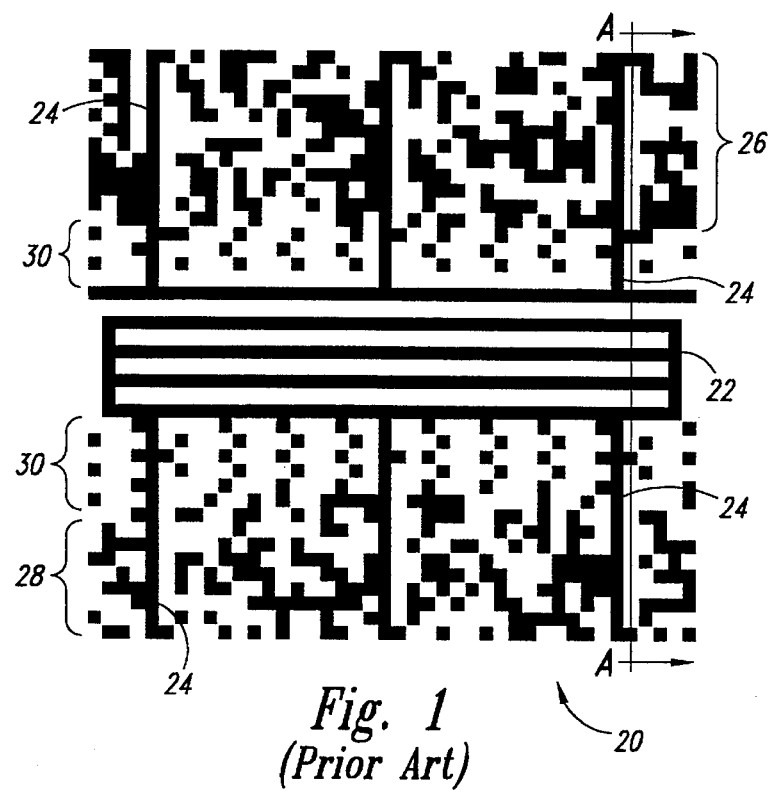
*Fig. 1*
*(Prior Art)*
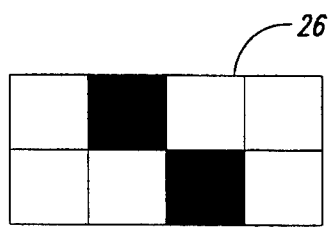
*Fig. 2*
*(Prior Art)*
*Fig. 3*
*(Prior Art)*
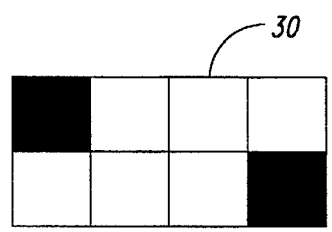
*Fig. 5*
*(Prior Art)*
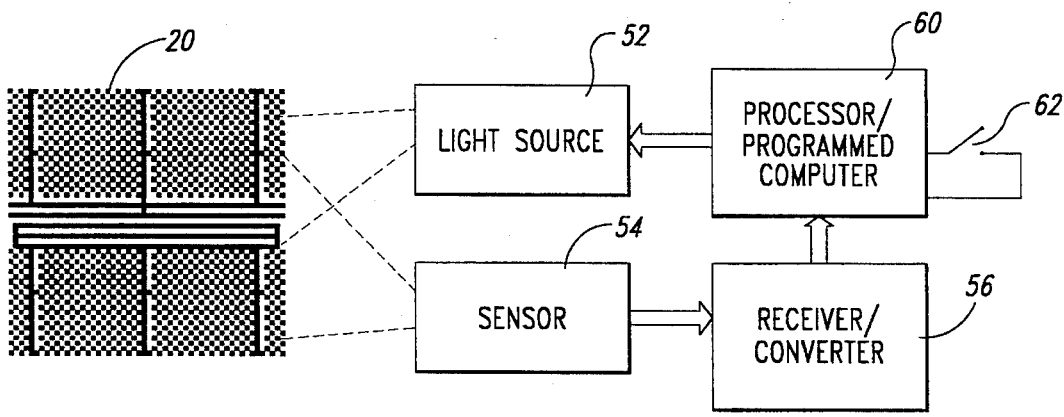
*Fig. 4*

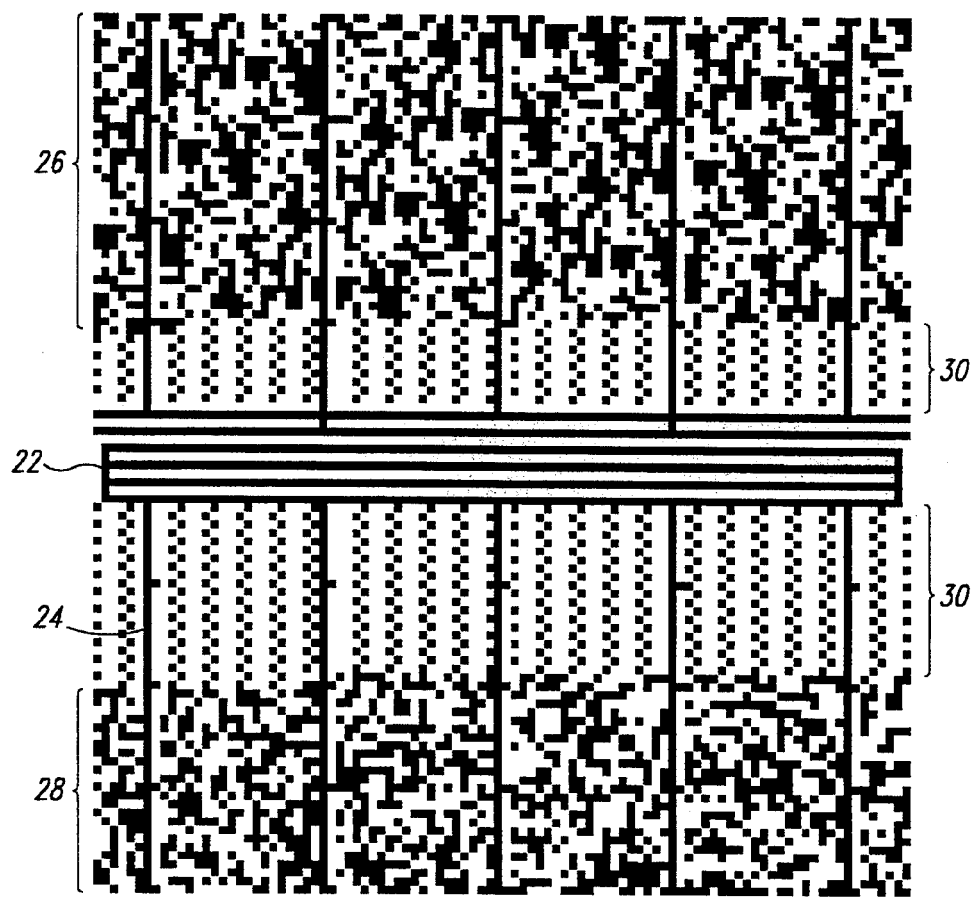
Fig. 8
*(Prior Art)*
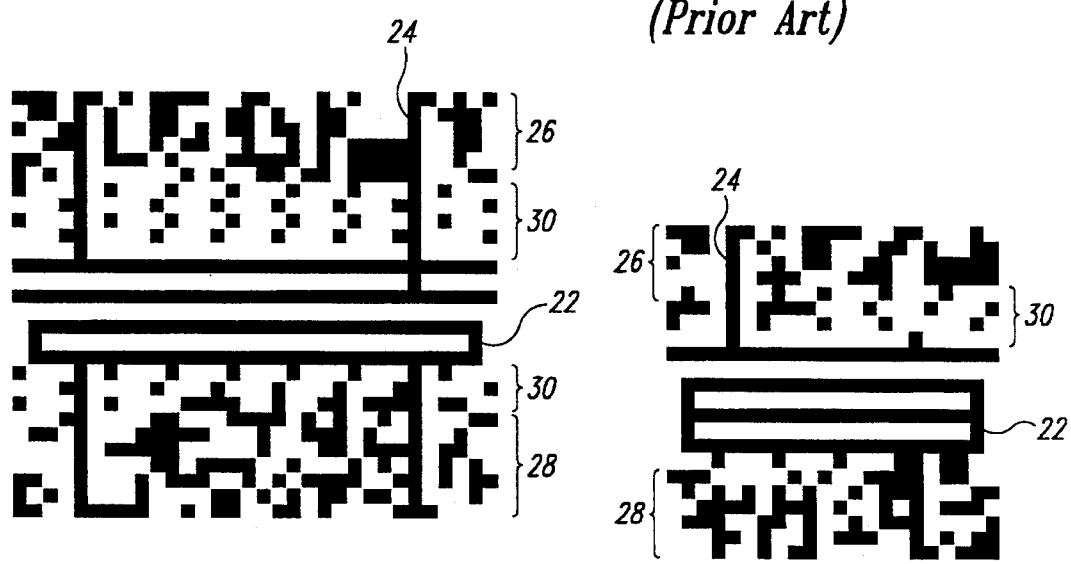
Fig. 9
*(Prior Art)*
Fig. 10
*(Prior Art)*

ERROR CORRECTION ENHANCEMENT FOR CODE ONE AND OTHER MACHINE-READABLE SYMBOLOGIES

TECHNICAL FIELD

The present invention relates to a method and apparatus for decoding machine-readable symbols, and more particularly, to a method and apparatus for decoding symbols requiring error correction.

BACKGROUND OF THE INVENTION

Bar code symbologies are widely used for automated data collection. The first bar code symbologies developed, such as U.P.C., Code 39, Interleaved 2 of 5, and Code 93, can be referred to as "linear symbologies" because data in a given symbol is decoded along one axis or direction. Symbologies such as linear symbologies encode "data characters" (i.e., human readable characters) as "symbol characters," which are generally parallel arrangements of alternating, multiple-width strips of lower reflectivity or "bars" separated by strips of higher reflectivity or "spaces." Each unique pattern of bars and spaces within a predetermined width defines a particular symbol character, and thus a particular data character or characters. A given linear symbol encodes several data characters along its length as several groups of unique bar and space patterns.

As the data collection markets grew, symbologies required greater amounts of information to be encoded within a smaller area (i.e., greater "information density"). To increase the information density in linear symbologies, "multi-row" or "stacked" symbologies were developed, such as Code 49 and PDF417. Stacked symbologies generally employ several adjacent rows of multiple-width bars and spaces. To further improve information density, "area" or "two-dimensional matrix" ("2D matrix") symbologies, such as Data Matrix and Code One, were developed. 2D matrix symbologies employ arrangements of regular polygon-shaped cells where the center to center distance of adjacent elements is uniform. In a 2D matrix symbology, an "element" is a cell or a space, while in a linear or stacked symbology an element is a bar or a space. The specific arrangement of the elements in 2D matrix symbologies represent data characters and/or symbology functions. Elements in Code One, for example, are arranged as matrices of small, square data cells.

Linear, stacked and 2D matrix symbologies are generally based on their "X dimension," which is the nominal width dimension of the narrow bars, spaces or data cells in the symbology. "Nominal" refers to the intended value for a specified parameter, regardless of printing errors, etc. For Code One, the X dimension represents the smallest height (or width) of a data cell in a given symbol.

As shown in FIG. 1, a Code One symbol 20 having an 80 rail. X dimension includes a center finder pattern 22 surrounded by a matrix of square data cells. The Code One symbology includes several versions, where each version has a predetermined size and unique finder pattern 22. In most versions of the Code One symbology, several vertical reference patterns 24 extend perpendicularly from the finder pattern 22. The finder pattern 22 and vertical reference patterns 24 help automated data collection devices, or "readers," locate the symbol 20, determine its version, determine its tilt and orientation, and provide reference points from which to decode the matrix of data cells.

Each data cell in the matrix encodes one bit of data: a white data cell represents a 0 and a black data cell represents a 1. As shown in FIG. 2, each symbol character in the Code One symbology is generally constructed from eight data cells in a rectangular array of two rows that each have four data cells. Each set of eight data cells in a Code One symbol character encodes an 8-bit byte of binary data. The lower right-most data cell in this rectangular symbol character is the least significant bit and has a value of $2^0=1$, while the top left-most data cell is the most significant bit and has a value of $2^7=128$.

As shown in FIG. 3, an exemplary Code One symbol character having a value of 66 (2+64), corresponding to the ASCII value "A" in the Code One symbology, is encoded by selecting the appropriate cells in a character to be black cells that together total the desired value. The ASCII values in the Code One symbology are equal to the standard ASCII values in the computer industry plus one; the ASCII value for "A" in the computer industry has a value of 65, which therefore has the value of 66 in the Code One symbology.

In a given Code One symbol, the symbol characters are ordered in a row-wise fashion from left to right, and the "rows" of symbol characters are arranged from top to bottom in a symbol. Each row of symbol characters in a Code One symbol consists of a pair of adjacent rows of data cells. The first symbol character in the Code One symbol is in the top left corner of the symbol and the last symbol character is in the bottom right corner. For certain versions of Code One symbols, some symbol characters are not contiguous, but are instead split by the finder pattern 22 or by one of the vertical reference patterns 24. Readers analyze the symbol characters in a Code One symbol from the first symbol character in the symbol's top left corner rightward to the right edge of the top row, and then from the left edge rightward along the second row, and so forth.

Assuming a reader encounters no difficulties, each symbol character analyzed in a Code One or other symbol is convened into corresponding data to be used by the reader, the user, or other peripheral equipment. Unfortunately, data encoded under nearly all symbologies can result in errors when decoded by a reader. Errors are often caused by poor print quality in a symbol, poorly-designed reading equipment, and so forth. Some linear symbologies are designed to reduce such errors. For example, the ratio of widths between narrow and wide "elements" (i.e., bars or spaces) in the Code 39 and Interleaved 2 of 5 symbologies are established so that known algorithms can distinguish between elements despite variations in the widths of the given elements.

To also reduce errors, certain symbologies include check characters. A check character is a character included within a symbol whose value is used to perform a mathematical check that determines whether the symbol has been decoded correctly. For example, Code 39 has an optional modulo 43 check character that can be included as the last symbol character in a symbol. The Code 39 check character is calculated by determining a character value for each data character in an original message, adding together all of the character values, and dividing the sum by 43. The check character becomes the remainder that results from such division, and is appended to the end of a symbol encoded from the message. A "character value" is a number representing a data character in a given symbology, For example, in the Code 39 symbology, the character "A" has a character value of "10."

As an example, the data character message "CODE 39" has the respective character values of 12, 24, 13, 14, 38, 3, and 9. The check character for this message is computed as follows:

$$\frac{12+24+13+14+38+3+9}{43} = 2, \text{remainder } 27.$$

Thus, the check character for the data character message "CODE 39" has a character value of 27, which corresponds to the data character "R."

Other symbologies improve upon the use of check characters by employing error correction characters. Error correction characters, as with check characters, are calculated mathematically from the other symbol characters in a symbol. Error correction characters are symbol characters in a symbol that are reserved for erasure correction, error correction, and/or error detection. An erasure is a missing, unscanned or undecodable symbol character: the symbol character's position is known, but not its value. An erasure can result from portions of a symbol having insufficient contrast, a symbol that falls outside a reader's field of view, or a portion of which is obliterated. An error is a misdecoded or mislocated symbol character; both the position and the value of the symbol character are unknown. An error can result from random spots or voids in a symbol when the symbol is printed.

For an error, the error correction characters allow a reader to use these characters in a symbol to locate and correct errors that have unknown values and locations. Two error correction characters are required to correct each error: one error correction character to locate the erroneous symbol character and the second error correction character to determine what value the erroneous symbol character should have been. For an erasure, the error correction characters allow a reader to use these characters to correct erroneous or missing symbol characters that have known locations. Consequently, only one error correction character is required to each erasure.

For error detection, the error correction characters allow a reader to use these characters in a symbol to detect the number of errors in the symbol that exceed the error correction capacity for the particular symbology. Error detection cannot correct the errors in the symbol, but can prevent a symbol from being decoded and producing erroneous data. Error correction characters can be reserved for error detection, and in most linear symbologies, such as Code 39, these characters are referred to as check characters, as discussed above.

Some symbologies, such as Code One, have many error correction characters. The Code One symbology is specifically designed with 27% to 50% of the symbol characters allocated to error correction. Consequently, the Code One symbology allows for very secure decoding that mathematically is many orders of magnitude more accurate than linear bar code symbologies that simply use check characters. As shown in FIG. 1, the Code One symbol 20 includes symbol characters 26 that begin at the top left corner of the symbol and error correction characters 28 that end at the bottom right corner of the symbol.

Since each version in the Code One symbology has a fixed symbol size, pad characters 30 are inserted between the symbol characters 26 and the error correction characters 28 to fill out a symbol that does not have enough symbol characters to completely fill in the symbol. The error correction characters 28 are algorithmically generated using standard Reed-Solomon error correction methods based on the data and pad characters 26 and 30. If a portion of the symbol 20 contains errors or erasures (i.e., damage), the symbol may in some cases be decoded based on the error correction characters 28.

Many error correction algorithms perform computations roughly analogous with solving linear equations wherein with two equations and two unknowns, one can readily compute the two unknowns. As noted above, the error correction characters 28 are computed using several equations with the symbol characters 26 and the pad characters 30. Therefore, using the several equations that generated the error correction characters 28, and undamaged symbol, pad, and error correction characters, a reader may determine the values of unknown symbol, pad, and error correction characters having erasure damage by solving the equations (if the number of unknown characters does not exceed the number of equations). Consequently, if a few symbol characters 26 are damaged, the remaining symbol characters 26, pad characters 30, and error correction characters 28 can be used to correct the damaged symbol characters, and likewise, damaged pad or error correction characters may be corrected based on the remaining symbol, pad, and error correction characters. Overall, there is a tradeoff between damaged symbol, pad and error correction characters 26, 30 and 28, and undamaged characters in a symbol that can be corrected under error correction algorithms.

The extent of any damage recoverable by the error correction characters 28 depends upon the amount and type of damage suffered by the symbol 20. As a general rule, if the damage to the symbol is an erasure, e.g., a portion of the symbol is obscured or lost, standard Code One readers can recover an area of erasure in the symbol that is approximately equal to an area remaining of the error correction characters in the symbol. For the symbol 20, if the portion of the symbol rightward of the dashed line A—A in FIG. 1 were obliterated (i.e., an erasure), the total area of this portion, above and below the finder pattern 22, is less than the total area of the error correction characters 28 that remain. Therefore, such a damaged symbol 20 can be corrected and a reader can replace the lost symbol characters and pad characters lost in the obliterated portion.

The obliterated portion rightward of the line A—A, however, is approximately equal to the maximum extent to which known error correction algorithms can recover for such lost characters. An equation for the maximum erasure damage that can be corrected under known error correction algorithms (ignoring the finder pattern 22) can be represented as follows:

$$E > A_{ERASE}$$

where E is the total area of error correction characters remaining in the symbol and $A_{ERASE}$ is the total area in the symbol lost due to erasure damage.

If the portion were not an erasure, but an error, the area of the portion having errors must be equal to approximately half the area of the remaining error correction characters because the remaining error correction characters must determine both the location of the errors and the correct value for each error. An equation for the maximum error damage that can be corrected under known algorithms (ignoring the finder pattern 22) can be represented as:

$$2(E) > A_{ERROR}$$

where $A_{ERROR}$ is the total area of the symbol suffering from error damage.

SUMMARY OF THE INVENTION

As represented in the claims below, the present invention, in a broad sense, embodies a method of error correction enhancement for a decoding routine, the decoding routine capable of decoding data collection symbols encoding data characters, a series of repeating characters, and error correction characters. The repeating characters can be pad characters under the Code One symbology, and the error correction characters are derived from the symbol and repeating characters. The method comprises the steps of: (i) locating at least one repeating character in a selected symbol having at least one damaged repeating character and at least one damaged symbol character; (ii) replacing the damaged repeating character with an undamaged repeating character; and (iii) decoding the selected symbol after replacing the damaged repeating character with the undamaged repeating character.

Similarly, the present invention embodies an apparatus for decoding a machine-readable symbol representing encoded information, the symbol having symbol characters encoding data characters, a series of repeating characters, and error correction characters that are derived from the symbol and repeating characters. The apparatus includes a sensor that receives light reflected from the symbol and produces an output signal therefrom. A receiver receives the output signal and produces a data signal indicative of at least some of the symbol characters, repeating characters, and error correction characters, but which fails to accurately indicate at least some of the symbol and repeating characters. A processor processes the data signal and produces a signal indicative of the information encoded in the symbol. The processor is programmed to (i) attempt to decode the symbol, (ii) determine if the symbol has any repeating characters if the symbol cannot be decoded, (iii) locate at least one repeating characters in the symbol, (iv) replace the repeating characters that fail to be accurately indicated in the data signal with repeating characters that are accurately indicated, and (v) attempt to decode the signal again after replacing the repeating characters that fail to be indicated in the data signal with the repeating characters that are accurately indicated.

Other features and associated advantages of the present invention will become apparent from studying the following detailed description, together with the accompanying drawings.

BRIEF DESCRIPTION OF THE DRAWINGS

FIG. 1 shows a prior art version D Code One symbol having an 80 mil. X dimension.

FIG. 2 shows the prior art layout for a typical Code One symbol character, and the binary weights for each data cell in the character.

FIG. 3 shows a prior art Code One symbol character having a binary value of 66, which represents the ASCII value of "A."

FIG. 4 shows a block diagram of a data collection symbology reader of the present invention.

FIG. 5 shows a prior art Code One symbol character having a binary value of 129, which corresponds to the pad character in the Code One symbology.

FIG. 8 shows a prior art version G Code One symbol having a 40 mil. X dimension and having numerous pad characters.

FIG. 9 shows a prior art version C Code One symbol having an 80 mil. X dimension and having a maximum number of pad characters.

FIG. 10 shows a prior art version B Code One symbol having an 80 mil. X dimension and having a maximum number of pad characters.

DETAILED DESCRIPTION OF THE PRESENTLY PREFERRED EMBODIMENT

As shown in FIG. 4, a data collection symbology reader 50 of the present invention includes a light source 52 that illuminates a data collection symbol, such as the Code One symbol 20. As used herein a "data collection symbol" refer to a symbol from any linear, stacked, 2D matrix or other machine-readable symbology. A sensor 54 in the reader 50 receives the light reflected from the symbol 20 and converts the received light into an electrical signal. The light source 52 is preferably a flash bulb, infrared light source, one or more LEDs or other light-emitting elements, while the sensor 54 is preferably a charge-coupled device ("CCD"), two-dimensional semiconductor array, ridicon, or other area imager capable of converting received light into electrical signals. The sensor 54 may also be a rasterizing laser scanner or a one dimensional CCD movable relative to the symbol.

Figure 7:
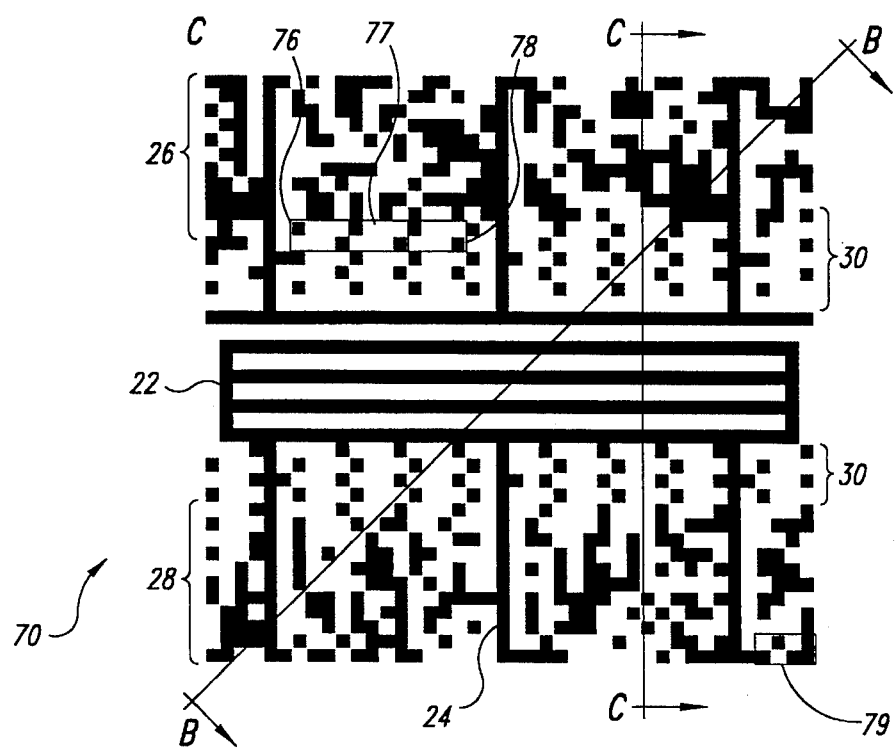
FIG. 7 shows a version D Code One symbol having an 80 mil. X dimension and having a maximum number of pad characters.

A receiver or converter 56 receives the electrical signal from the sensor 54 and converts it into a signal to be processed by a programmed computer or processor 60. Typically, the sensor 54 produces an analog signal that represents the modulated light reflected from the elements in the symbol 20. If the processor 60 is a digital computer, then the converter 56 converts the analog signal into a digital signal to be processed by the processor. The converter 56 and/or processor 60 preferably include memory for storing the digital signal. As described more fully below, the reader 50 performs a routine stored in the memory that locates pad characters 30 (such as shown in FIG. 7) in a damaged Code One symbol and replaces any lost pad characters in the symbol before performing standard error correction to thereby improve error correction performance of the reader.

The sensor 54 preferably includes a rectangular array of photosensitive elements, such as a CCD. Each pixel element in the rectangular array outputs a grey level signal, i.e., an analog signal that determines the amount or intensity of light impinging upon the particular pixel element. Alternatively, each pixel element in the array of the sensor 54 can output a binary signal indicating that the particular pixel element is either black or white. After the signals from the sensor 54 are appropriately converted by the converter 56, the processor 60 stores the signals produced by the sensor as an image within a field of view of the sensor. As a result, the processor 60 may repeatedly analyze and manipulate the stored signals.

The reader 50 can be a hand-held product and include a trigger switch 62 coupled to the processor 60. By actuating the trigger switch 62, the processor 60 causes the light source 52 to provide light to the symbol 20 that is reflected therefrom to the sensor 54. Since the processor 60 stores the signals that are output from the sensor 54 and converted by the converter 56, a user, by actuating the trigger switch 62, can cause the reader 50 to store an instantaneous image within the field of view of the reader, creating a "snapshot" of the symbol 20. The specific means and method for storing and locating an image of a symbol by the reader 50 are known and will be understood by those skilled in the relevant art without need for further description herein (e.g., U.S. Pat. No. 5,155,343).

Figure 6:
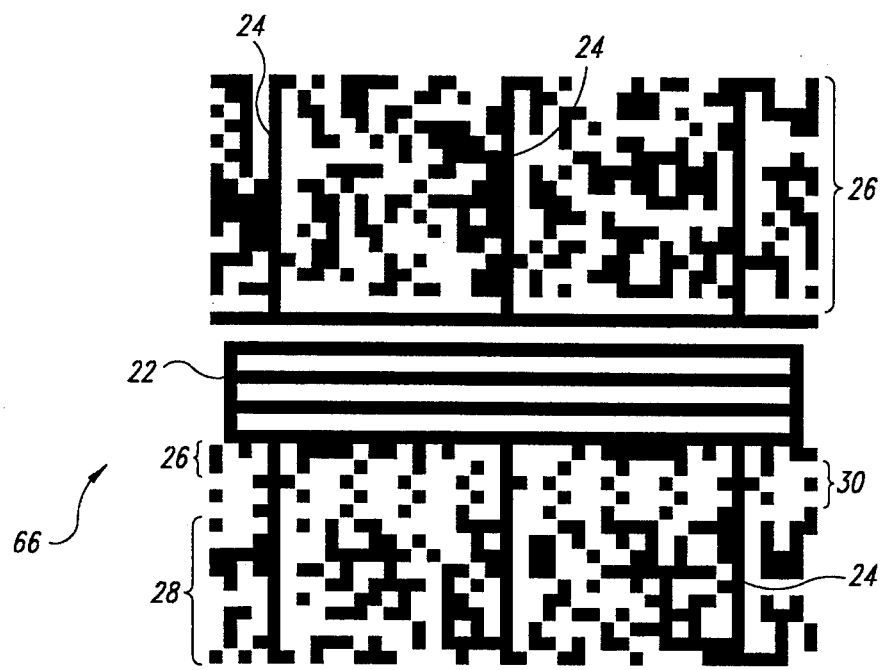
FIG. 6 shows a prior art version D Code One symbol having an 80 mil. X dimension and having few pad characters.

In all Code One symbols, all pad characters 30 have the same character value of 129, and thus the same symbol character as shown in FIG. 5. FIG. 1 shows an average number of pad characters 30 in the symbol 20, while FIGS. 6 and 7 show approximately a minimum and a maximum number of pad characters, respectively, for respective version D Code One symbols 66 and 70. Other versions of Code One symbols may similarly contain pad characters, as shown in FIGS. 8, 9, and 10 for respective versions G, C and B of Code One symbols. The Code One symbols shown in FIGS. 6 through 10 each include a finder pattern 22, vertical reference patterns 24, symbol data characters 26, error correction characters 28, and pad characters 30.

If the number of pad characters 30 exceed a maximum for a given version in the Code One symbology, the next smaller version Code One symbol is used. For example, if one less data character 26 were encoded in the symbol 20 of FIG. 7, a version C Code One symbol would be printed, such as that shown in FIG. 9.

Figure 11A:
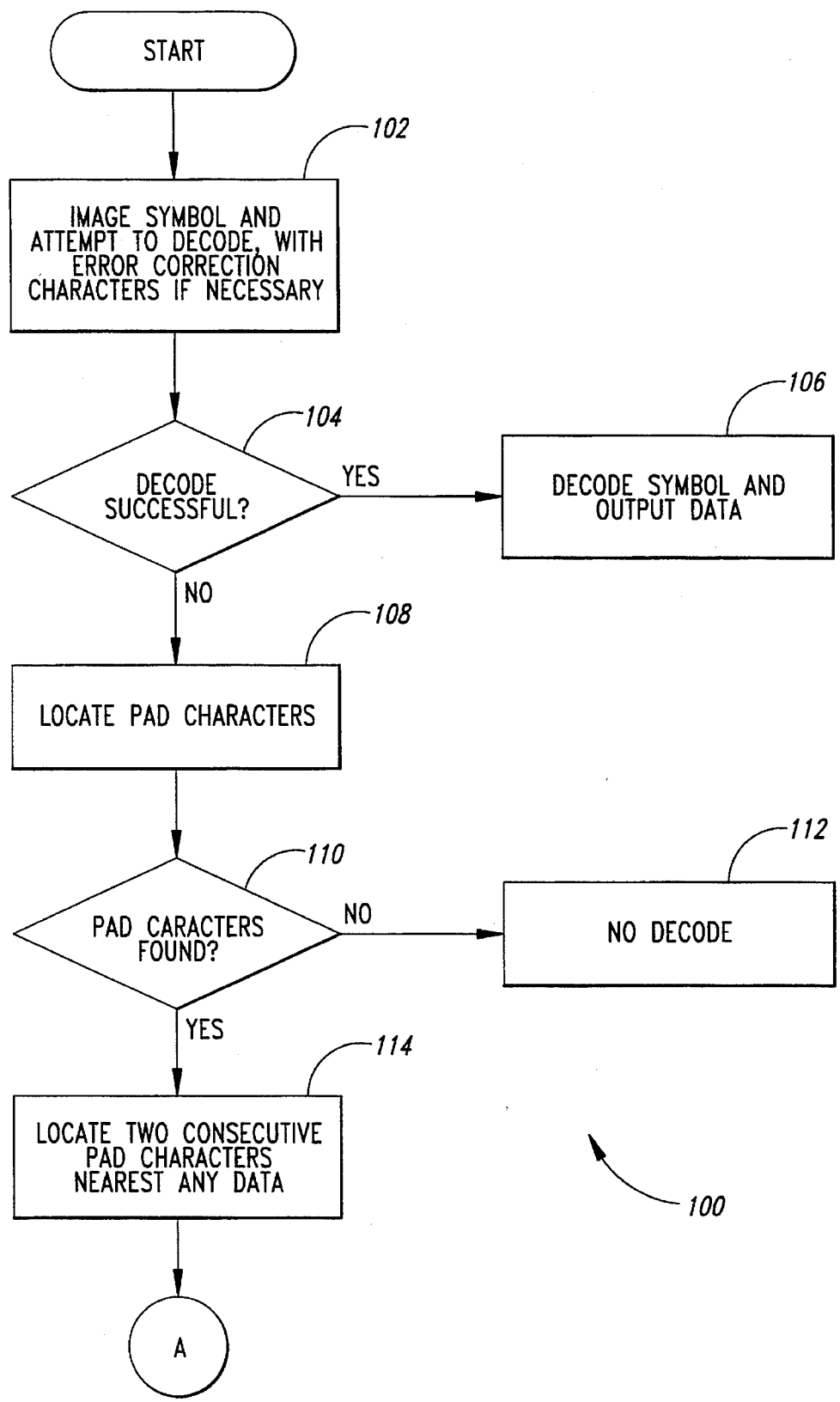
FIGS. 11A and 11B are flowcharts which together show a method of error correction enhancement according to the present invention for Code One symbols.
Figure 11B:
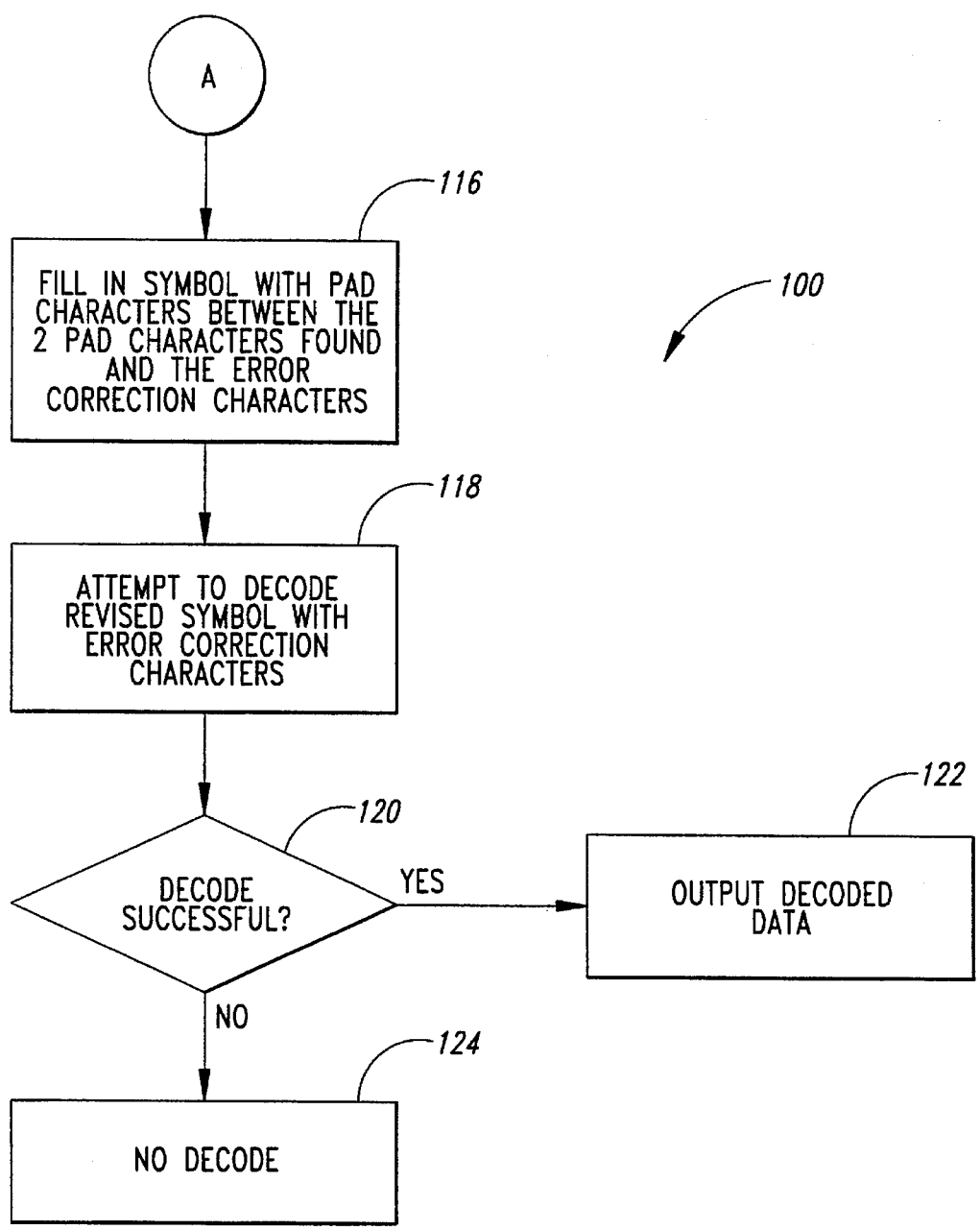

Referring to FIGS. 11A and 11B, an error correction enhancement routine 100, executed by the processor 60, begins in step 102 by imaging a symbol such as the symbol 70 of FIG. 7 and attempting to decode it. In step 102, the processor 60 determines the location, orientation and outer boundaries of the symbol 70 within the image stored in the memory using known techniques, such as by using sampling paths through the stored image. The processor 60 locates the position and orientation of the symbol 70 by locating the position and orientation of the finder pattern 22 and vertical reference patterns 24. The processor 60 also determines the version of the symbol 70 by analyzing the finder pattern 22, since the finder pattern is unique for each version of Code One symbols.

The processor 60, having located the orientation, and thus the "top," of the symbol 70, begins sequentially reading the symbol characters 26 from the top left corner of the symbol to the bottom right corner and attempts to decode the characters by converting a given symbol character into its corresponding character value. The processor 60 attempts to decode all of the symbol characters 26, and employs the error correction characters 28 to detect and correct any damage in the symbol 70. As used generally herein, the term "damage" refers not only to erasures and errors affecting a symbol itself, but also erasures and errors caused from unscanned, undecodable, misdecoded or mislocated symbols or symbol characters. Standard decode and error correction algorithms for Code One symbols are known in the art and need not be described herein.

Figure 12:
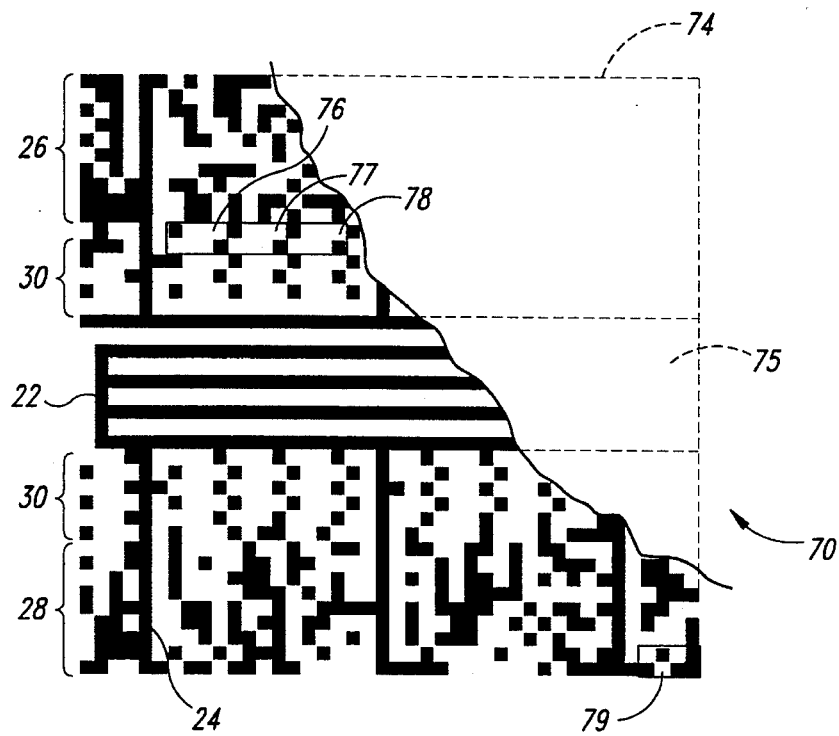
FIG. 12 shows the symbol of FIG. 7 with a portion of it destroyed.

As shown in FIG. 12, the symbol 70 has a top right portion 74 (shown in dashed lines) that is obliterated or torn away, and is thus an erasure. The processor 60 in step 102 locates the position and orientation of the symbol 70 based on the portion remaining of the center finder pattern 22 and the vertical reference patterns 24. The dimensions or size of a given Code One symbol are fixed for a particular version. Therefore, since the processor 60 can determine the version from at least a portion of the finder pattern 22, the processor can determine the outer boundaries of the symbol 70, including tile lost portion 74.

Referring back to FIG. 11 A, if the decode is successful (i.e., all symbol characters 26 are converted to their appropriate character values and no errors are detected), then in step 106, the processor 60 outputs the decoded data to the user, a device or other desired application. If the decode was unsuccessful, then in step 108, the processor 60 attempts to locate at least one, but preferably two or more, pad characters 30 in the symbol 70. If the processor 60 fails to locate any pad characters 30 in the symbol 70 in step 110, then in step 112, the processor 60 determines that the symbol 70 cannot be decoded. However, if the processor 60 locates at least one pad character 30 in the symbol 70 in step 110, then in step 114, the processor locates the pad character that is most proximate, or preferably at least two pad characters that are sequentially adjacent, to the symbol characters 26 in the symbol.

In the Code One symbology, pad characters 30 perform three functions. First, when one or more pad characters 30 appear at the end of the symbol characters 26, and before the error correction characters 28, they represent no data, but instead are used to fill in a symbol when the symbol characters do not entirely fill the symbol. Second, when a single pad character is inserted within the symbol characters 26, it functions as a data separator. As a result, the reader 50 treats any data encoded before and after the single pad character as if such data came from two separate symbols. Third, if a single pad character is the first symbol character in a symbol, then this character functions as a symbology identifier for the reader. The Automatic Identification Manufacturers ("AIM") provide a standardized method by which readers may automatically discriminate between various symbologies. Therefore, by encoding a pad character as the first character in a Code One symbol, readers can automatically determine that the symbol to be read by the reader is a Code One symbol.

Under the routine 100, the processor 60 must identify the particular function to which a pad character in a symbol is being used. The second and third functions require only one pad character, while the first function requires one or more such characters. Therefore, the processor 60 in step 114 locates two or more pad characters 30 in the symbol 70 to ensure that the pad characters represent no data and are thus used for the first above-described function. While the processor 60 need only locate one, and preferably two, pad characters 30 in the symbol 70, by locating three or more consecutive pad characters, the processor's chances of determining that the three pad characters represent no data substantially increases.

Additionally, as described below, the error correction enhancement routine 100 of the present invention is more powerful when it is able to replace the most number of pad characters lost within a given symbol. Therefore, while the processor 60 need only locate two consecutive pad characters anywhere between the symbol characters 26 and the error correction characters 28, the processor locates at least two pad characters closest to the symbol characters 26 or the error correction characters 28.

Referring back to FIG. 12, since over a third of the symbol 70 is obliterated, exclusive of an obliterated portion 75 of the finder pattern 22, the processor 60 cannot decode the symbol under standard decode algorithms, and thus the decode is unsuccessful in step 104 of FIG. 11A. The processor 60 therefore finds at least two pad characters 30 in steps 108 and 110, and then locates two consecutive, undamaged pad characters 30 closest to the symbol characters 26 in step 114. The processor 60 knows the orientation of the symbol 70, and thus recognizes that symbol characters 26 of FIG. 12 are above the finder pattern 22. The processor 60 samples each recognizable data character 26 sequentially from the top left-most corner of the symbol 70 rightward until the processor fails to sample any recognizable symbol characters, and then begins sampling the next row of symbol characters from left to right. The processor 60 continues in this fashion until it locates the two consecutive pad characters closest to the symbol characters 26, which are shown in FIG. 12 as the pad characters 76 and 77. To further improve error correction performance as noted above, the processor 60 can locate a third consecutive pad character 78, adjacent to the pad character 77 as shown in FIG. 12.

In step 116 of FIG. 11B, the processor 60 fills or replaces in the symbol 70 with pad characters 30 between the two pad characters 76 and 77 up to the first of the undamaged error correction characters 28. Since the processor 60 knows the outer boundaries of the symbol 70 from step 102, the processor adds consecutive pad characters 30 rightward and downward following the first two pad characters 76 and 77, until the processor recognizes a remainder of the symbol that is undamaged or up until the start of the error correction characters 28. Alternatively, the processor 60 can fill in all pad characters 30, following the first two pad characters 76 and 77 and up to the first error correction character 28, regardless of whether any pad characters are damaged in the symbol 70.

If the symbol 70 is damaged to such an extent that the beginning of the error correction character is unknown, the processor 60 may nevertheless fill in the symbol with the appropriate number of pad characters 30 because each version of Code One symbols contains a fixed number of error correction characters 28, regardless of the number of symbol characters 26, as shown below in Table 1.

TABLE 1

Number of Data and Error Correction Characters for Each Code One Version

| Code One Version | Total Number of Symbol Data Characters Available | Fixed Number of Error Correction Characters |
|---|---|---|
| A | 10 | 10 |
| B | 19 | 16 |
| C | 44 | 26 |
| D | 91 | 44 |
| E | 182 | 70 |
| F | 370 | 140 |
| G | 732 | 280 |
| H | 1480 | 560 |

Therefore, based on Table 1, which can be stored in the memory of the reader 50, the processor 60 determines the number of error correction characters in the symbol 70. Since the processor 60 knows the position and orientation of the symbol 70, and that the last character in the symbol (i.e., a bottom right-most character 79) is the last of the error correction characters 28, the processor can move consecutively backward from the last character to determine the beginning of the error correction characters in the symbol.

Figure 13:
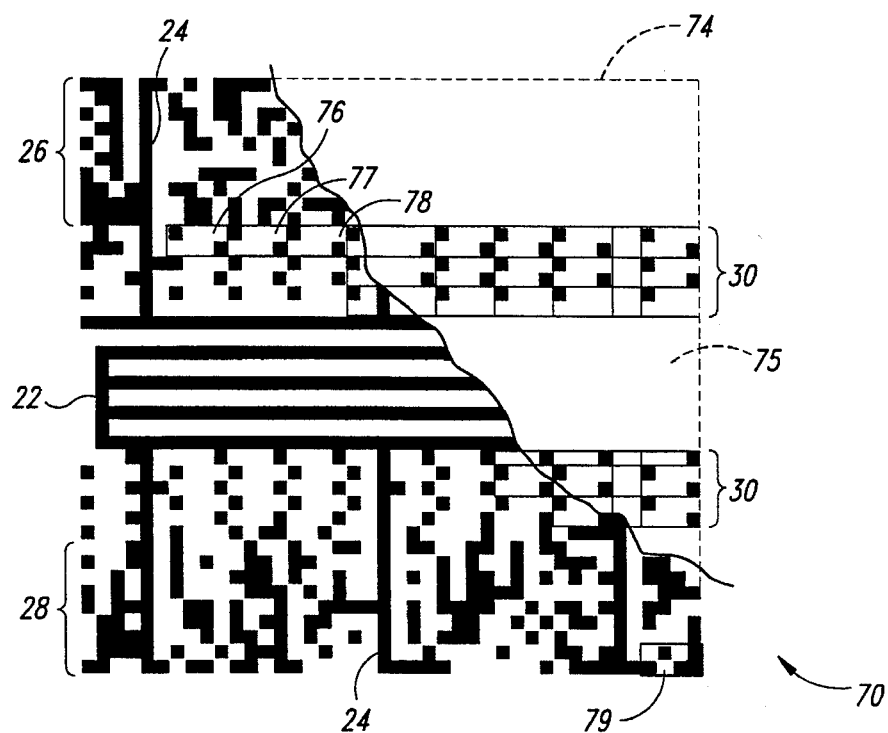
FIG. 13 shows the symbol of FIG. 12 as revised using the method of FIGS. 11A and 11B.

As shown in FIG. 13, the processor 60 fills in all pad characters 30 within the obliterated top right portion 74, following the first two pad characters 76 and 77. Having filled in the obliterated pad characters, and ignoring the obliterated portion 75 of the finder pattern 22, a substantially decreased portion of the symbol 70 is obliterated. Therefore, the processor 60, under standard error correction algorithms, has an enhanced chance of decoding the symbol 70 since the amount of remaining portion in the symbol 70 that is obliterated is less than the total area of error correction characters 28 in the symbol.

Consequently, after filling in the pad characters, the processor 60 in step 118 attempts to decode the revised symbol using standard error correction and decoding techniques. If the processor 60 determines in step 120 that it can decode the revised symbol, then in step 122, the decoded data is output to an appropriate device or application. Otherwise, if the processor determines in step 120 that the symbol 70 could not be decoded, then in step 124, the processor 60 determines that the symbol contains such damage that it cannot be accurately decoded. When the processor 60 determines that the symbol 70 cannot be accurately decoded, in either step 124 or step 112, the processor does nothing or preferably provides a visual and/or auditory signal to the user indicating that the symbol cannot be decoded.

Under the routine 100 of the present invention, symbols having erasure damage over nearly 50% of the symbol can nevertheless be decoded. For example, as shown in FIG. 7, if the symbol 70 were obliterated from the line B—B down and rightward, the routine 100 can decode this symbol. Similarly, the routine 100 of the present invention can decode the symbol 70 if the symbol were obliterated from the line C—C rightward.

Under the present invention, the maximum erasure damage to which a symbol may undergo while still being decodable under the present invention would be a symbol that still includes approximately one-third of the symbol characters 26, only the two pad characters 76 and 77 that immediately follow the remaining symbol characters 26, all of the error correction characters 28, and either the entire leer or right edge of the finder pattern 22, or other combinations of features in the symbol known to those skilled in the relevant art. Overall, for erasure damage, the present invention can decode a symbol whose total area of error correction characters remaining is greater than the area of the top right portion 74 in the symbol 70 obliterated or lost minus the area lost due to pad characters 30 (ignoring the center finder pattern 22). An equation for the maximum erasure damage that the present invention may correct can be represented as follows:

$$E > A_{ERASE} - P$$

where P is the total area in the symbol of pad characters undecodable due to erasure damage.

The present invention is described above as "locating" pad characters (e.g., in step 108); however, the present invention need not necessarily locate the images of such pad characters within the image stored in the memory. Instead, the processor 60 can store a string of character values corresponding to the character values for the symbol characters 26, pad characters 30 and error correction characters 28 determined during the initial attempt to decode the symbol 70 in step 102. Thereafter, in steps 108, 110 and 114, the processor 60 can locate pad characters 30 by analyzing the stored string of character values for the first three occurrences of the character value 129 (which corresponds to the pad character in the Code One symbology).

Similarly, while the present invention is described as "filling in" or replacing the pad characters 30 in the symbol 70 (e.g., step 116), the processor 60 can fill in the character value of 129 in the string of character values for all pad characters that are damaged or which fail to be indicated therein. The processor 60 need not insert the appropriate pixel values within the stored image or otherwise create some replacement of the pad character 30 itself.

While the present invention is generally described above for purposes of illustration with respect to the erasure damage shown in FIGS. 12 and 13, the present invention is equally applicable to error damage on a combination of erasure and error damage. For a symbol having only error damage, the present invention can decode a symbol whose total area of error correction characters remaining is at least twice as great as an area in the symbol 70 having errors, minus the area having erroneous pad characters (again, ignoring the center finder pattern 22). An equation for the maximum error damage the present invention may correct can be represented as follows:

$$2E > A_{ERROR} - P$$

Additionally, while the present invention has been described with respect to FIGS. 12 and 13 having the top right portion 74 of the symbol 70 obliterated, other portions of the symbol may similarly be obliterated or otherwise affected to provide erasure (and/or error) damage that reveals different percentages of symbol, pad, and error correction characters 26, 30, and 28, respectively. Consequently, while few error correction characters 28 are obliterated in the symbol 70, the present invention can still decode a symbol having a greater number of error correction characters obliterated if such obliterated characters are offset by an equal number of data correction characters 26 that are undamaged. In either case, the present invention allows missing/erroneous pad characters 30 to be replaced/corrected before the processor 60 executes any error correction algorithms to decode the symbol.

Although the present invention is described above with respect to correcting damage in Code One symbols, the present invention is equally applicable to all other data collection symbologies, particularly symbologies that have regularly repeating symbol characters, such as PDF417 and Maxi Code. Those skilled in the art will recognize that the above-described invention provides a method of enhancing error correction for such symbologies. While specific embodiments of, and examples for, the present invention have been described for purposes of illustration, various equivalent modifications can be made without departing from the spirit and scope of the invention. Therefore, the present invention is not limited by the disclosure, but instead its scope is to be determined entirely by reference to the following claims.

We claim:

1. A method of error correction enhancement for machine-readable symbols having symbol characters, a series of consecutive repeating characters, and error correction characters derived from the symbol and repeating characters, the method comprising the steps of:

reading a selected machine-readable symbol, the selected symbol having at least one damaged repeating character;

attempting to decode the selected symbol;

if the selected symbol cannot be decoded, then determining if the selected symbol has any repeating characters;

locating at least two consecutive repeating characters in the selected symbol;

replacing the damaged repeating character with an undamaged repeating character; and decoding the selected symbol, using at least the error correction characters, after replacing the damaged repeating character with the undamaged repeating character.

2. The method of claim 1 wherein the repeating characters have a unique character value, wherein the step of attempting to decode converts the selected symbol into a string of character values, wherein the step of locating locates at least two consecutive occurrences of the unique character value in the string of character values, and wherein the undamaged repeating character in the steps of replacing and decoding is the unique character value.

3. The method of claim 1 wherein the step of locating locates three consecutive repeating characters.

4. The method of claim 1 wherein the selected symbol read in the step of reading is a Code One symbol.

5. The method of claim 4 wherein the repeating characters in the Code One symbol are pad characters and the step of locating locates two pad characters.

6. The method of claim 1 wherein the step of locating locates at least two consecutive repeating characters most proximate to the symbol characters.

7. The method of claim 6 wherein the step of replacing replaces all damaged repeating characters in the selected symbol until all damaged repeating characters in the series of repeating characters are replaced with undamaged repeating characters.

8. An apparatus for decoding a machine-readable symbol representing encoded information, the symbol having symbol characters, a series of repeating characters, and error correction characters derived from the symbol and repeating characters, the apparatus comprising:

a sensor that receives light reflected by the symbol and produces an output signal therefore;

a receiver that receives the output signal and produces a data signal indicative of at least some of the symbol characters, repeating characters and error correction characters, but which fails to accurately indicate at least some of the symbol and repeating characters; and a processor for processing the data signal and producing a signal indicative of the information encoded in the symbol, the processor being programmed to (i) attempt to decode the symbol, (ii) determine if the symbol has any repeating characters if the symbol cannot be decoded, (iii) locate at least two repeating characters in the symbol, (iv) replace the repeating characters that failed to be accurately indicated in the data signal with accurately indicated repeating characters, and (v) attempt to decode the symbol again after replacing the repeating character with accurately indicated repeating characters that failed to be indicated in the data signal.

9. The apparatus of claim 8 wherein the sensor is a two-dimensional CCD.

10. The apparatus of claim 8 wherein the sensor is a rasterizing laser scanner.

11. The apparatus of claim 8 wherein the sensor is a movable one-dimensional CCD.

12. The apparatus of claim 8 wherein the repeating characters have a unique character value, wherein the processor is programmed to convert the symbol characters into a string of character values as the processor attempts to decode the symbol, wherein the processor is programmed to locate at least two repeating characters by locating at least two occurrences of the unique character value in the string of character values, and wherein the processor is programmed to replace each repeating character that failed to be accurately indicated with the unique character value, the unique character value corresponding to the accurately indicated repeating characters.

13. The apparatus of claim 8 wherein the sensor produces an output signal representative of a Code One symbol.

14. The apparatus of claim 13 wherein the data signal produced by the receiver indicates at least some pad characters.

15. The apparatus of claim 8 wherein the processor locates at least two repeating characters in the symbol that are most proximate to one of the symbol or error correction characters.

16. The apparatus of claim 15 wherein the processor locates three consecutive repeating characters and replaces all repeating characters that fail to be indicated in the data signal until all repeating characters in the series of repeating characters are indicated.

17. A method of error correction enhancement in a decoding routine, the decoding routine for decoding data collection symbols having symbol characters, a series of repeating characters, and error correction characters derived from the symbol and repeating characters, the method comprising the steps of:

locating at least one repeating character in a selected symbol having at least one damaged repeating character and at least one damaged symbol character;

replacing the damaged repeating character with an undamaged repeating character; and decoding the selected symbol after replacing the at least one damaged repeating character with the undamaged repeating character.

18. The method of claim 17 wherein the repeating characters have a unique character value, wherein the step of locating locates at least two occurrences of the unique character value in a string of character values, and wherein the undamaged repeating character in the steps of replacing and decoding is the unique character value.

19. The method of claim 17 wherein the step of locating locates two consecutive repeating characters in a Code One symbol.

20. The method of claim 19 wherein the step of replacing replaces a pad character.

21. The method of claim 17 wherein the step of locating locates at least three consecutive repeating characters most proximate to the symbol characters in the selected symbol.

22. The method of claim 21 wherein the step of replacing replaces all damaged repeating characters in the selected symbol until all repeating characters in the series of repeating characters are replaced with undamaged repeating characters.

\* \* \* \* \*